(12) United States Patent
Yamada

(10) Patent No.: US 9,319,022 B2
(45) Date of Patent: Apr. 19, 2016

(54) RESONATOR ELEMENT, RESONATOR, OSCILLATOR, AND ELECTRONIC APPARATUS

(71) Applicant: Seiko Epson Corporation, Tokyo (JP)

(72) Inventor: Akinori Yamada, Ina (JP)

(73) Assignee: Seiko Epson Corporation (JP)

( * ) Notice: Subject to any disclaimer, the term of this patent is extended or adjusted under 35 U.S.C. 154(b) by 329 days.

(21) Appl. No.: 13/948,403

(22) Filed: Jul. 23, 2013

(65) Prior Publication Data

US 2014/0029179 A1 Jan. 30, 2014

(30) Foreign Application Priority Data

Jul. 26, 2012 (JP) .................................. 2012-166116

(51) Int. Cl.
*H03H 9/215* (2006.01)
*H03H 9/21* (2006.01)

(52) U.S. Cl.
CPC *H03H 9/215* (2013.01); *H03H 9/21* (2013.01)

(58) Field of Classification Search
CPC ................................. H03H 9/21; H03H 9/215
USPC .......................................................... 310/370
See application file for complete search history.

(56) References Cited

U.S. PATENT DOCUMENTS

| 3,462,939 | A | * | 8/1969 | Kato et al. ..................... 368/157 |
|---|---|---|---|---|
| 4,540,909 | A | | 9/1985 | Takahashi et al. |
| 6,700,313 | B2 | * | 3/2004 | Dalla Piazza et al. ........ 310/370 |
| 6,871,572 | B1 | * | 3/2005 | Haussler et al. ................. 83/542 |
| 7,084,556 | B1 | * | 8/2006 | Dalla Piazza et al. ........ 310/370 |
| 8,400,048 | B2 | * | 3/2013 | Shirai et al. ................... 310/370 |
| 8,987,979 | B2 | * | 3/2015 | Tamura ......................... 310/370 |
| 2007/0188055 | A1 | | 8/2007 | Kuwahara |
| 2009/0021120 | A1 | * | 1/2009 | Dalla Piazza et al. ........ 310/370 |
| 2010/0164331 | A1 | * | 7/2010 | Yamada ......................... 310/370 |
| 2010/0171397 | A1 | | 7/2010 | Yamada |
| 2011/0001394 | A1 | * | 1/2011 | Dalla Piazza et al. ........ 310/325 |
| 2012/0098389 | A1 | * | 4/2012 | Dalla Piazza et al. ........ 310/348 |
| 2012/0291551 | A1 | * | 11/2012 | Moore ........................ 73/504.16 |

FOREIGN PATENT DOCUMENTS

| CH | 703271 A2 | * 12/2011 | |
| EP | 2015449 A1 | * 1/2009 | ............... H03H 9/10 |
| JP | 59-019419 | 1/1984 | |
| JP | 59-138114 | 8/1984 | |
| JP | 59-183520 | 10/1984 | |
| JP | 60-021614 | 2/1985 | |
| JP | 61-187411 | 8/1986 | |
| JP | 03-010511 | 1/1991 | |

(Continued)

*Primary Examiner* — J. San Martin
(74) *Attorney, Agent, or Firm* — Harness, Dickey & Pierce, P.L.C.

(57) ABSTRACT

A resonator element includes a base section, a pair of vibrating arms projecting from the base section in a +Y-axis direction, and arranged in an X-axis direction intersecting with the Y-axis direction with a distance in a plan view, and a support arm disposed between the pair of vibrating arms and projecting from the base section in the +Y-axis direction. The base section includes a first shrunk-width portion disposed on an opposite side to the side on which the support arm projects taking the center of the base section as a boundary, and within a range of the distance, and having a length in the X-axis direction gradually decreasing with a distance from the support arm in a plan view.

19 Claims, 14 Drawing Sheets

(56) References Cited

FOREIGN PATENT DOCUMENTS

| JP | 2002-141770 A | 5/2002 |
| JP | 2005-236563 A | 9/2005 |
| JP | 2007-201936 A | 8/2007 |
| JP | 2010-157933 A | 7/2010 |
| JP | 2010-171965 A | 8/2010 |
| JP | 2010-171966 A | 8/2010 |
| JP | 2011-015101 A | 1/2011 |

* cited by examiner

RESONATOR ELEMENT, RESONATOR, OSCILLATOR, AND ELECTRONIC APPARATUS

BACKGROUND

1. Technical Field

The present invention relates to a resonator element, a resonator, an oscillator, and an electronic apparatus.

2. Related Art

As the vibration device such as a quartz crystal oscillator, there is known a device provided with a tuning-fork resonator element having a plurality of vibrating arms (see, e.g., JP-A-2002-141770 (Document 1)). The resonator element of Document 1 has a base section having a roughly rectangular planar shape, two vibrating arms extending from the base section so as to be arranged in parallel to each other, and a support section extending from the base section and located between the two vibrating arms. In such a resonator element, there is a problem that the base section is easily deformed due to the flexural vibration of the two vibrating arms in an in-plane direction, the deformation causes the vibration leakage, and thus, the Q value is lowered.

SUMMARY

An advantage of some aspects of the invention is to provide a resonator element, which suppresses the vibration leakage, and has excellent vibration characteristics, a resonator, an oscillator, and an electronic apparatus equipped with the resonator element.

The invention can be implemented as the following forms or application examples.

APPLICATION EXAMPLE 1

A resonator element according to this application example of the invention includes a base section, a pair of vibrating arms projecting from the base section on a same side, and arranged with a distance in a direction intersecting with a direction of the projection in a plan view, and a support arm disposed between the pair of vibrating arms, and projecting from the base section on the same side as the pair of vibrating arms, and the base section includes a first shrunk-width portion disposed on an opposite side to the side on which the support arm projects taking a center of the base section as a boundary, and having a width in the intersecting direction gradually decreasing with a distance from the support arm in a plan view.

According to this application example of the invention, the vibration of the vibrating arms is canceled out (relaxed, absorbed) by the first shrunk-width portion, and thus, the vibration leakage can be suppressed. Therefore, the resonator element having excellent vibration characteristics can be obtained.

APPLICATION EXAMPLE 2

In the resonator element according to the above application example of the invention, it is preferable that a contour of the first shrunk-width portion has a symmetric shape having a pair of tilted portions each having a linear shape about a line along a direction perpendicular to the intersecting direction in a plan view.

According to this application example of the invention, the shape of the first shrunk-width portion is simplified.

APPLICATION EXAMPLE 3

In the resonator element according to the above application example of the invention, it is preferable that the first shrunk-width portion is provided with an angle formed by the pair of tilted portions used as sides.

According to this application example of the invention, the tip of the first shrunk-width portion is provided with a sharp shape, and thus, the vibration leakage can more effectively be suppressed.

APPLICATION EXAMPLE 4

In the resonator element according to the above application example of the invention, it is preferable that a contour of the first shrunk-width portion has an arc-like symmetric shape about a line along a direction perpendicular to the intersecting direction in a plan view.

According to this application example of the invention, the tip of the first shrunk-width portion is provided with a simple shape, and at the same time, the vibration leakage can more effectively be suppressed.

APPLICATION EXAMPLE 5

In the resonator element according to the above application example of the invention, it is preferable that a maximum value of a width of the first shrunk-width portion in the intersecting direction is larger than an amount of the distance.

According to this application example of the invention, the vibration leakage can more effectively be suppressed.

APPLICATION EXAMPLE 6

In the resonator element according to the above application example of the invention, it is preferable that the base section of the support arm is provided with a through hole penetrating in a thickness direction of the base section.

According to this application example of the invention, since the vibration of the vibrating arms can be inhibited from being transmitted to the support arm via the base section, the vibration leakage can more effectively be suppressed. Further, it is also possible to shift the natural vibration frequency in the in-phase mode of the vibrating arms toward the lower frequency side.

APPLICATION EXAMPLE 7

In the resonator element according to the above application example of the invention, it is preferable that the base section includes a second shrunk-width portion disposed between the pair of vibrating arms, and having a length in the intersecting direction gradually decreasing along a direction in which the vibrating arms project, and the support arm projects from the second shrunk-width portion.

According to this application example of the invention, due to the synergistic effect of the first and second shrunk-width sections, the vibration leakage can more effectively be suppressed.

APPLICATION EXAMPLE 8

A resonator element according to this application example of the invention includes a base section, a pair of vibrating arms extending from one side of the base section, a support arm disposed between the pair of vibrating arms, and extending from the one side of the base section, a projection section disposed in an area on the other side of the base section, which is an opposite side of the one side of the base section, and corresponds to the support arm, and a pair of shrunk-width portions respectively disposed on both sides of the projection section, each having a width in a direction in which the pair of vibrating arms are arranged, the width increasing along a direction toward the one side of the base section.

According to this application example of the invention, the vibration of the vibrating arms is canceled out (relaxed, absorbed) by the shrunk-width portions, and thus, the vibration leakage can be reduced. Therefore, the resonator element having excellent vibration characteristics can be obtained.

APPLICATION EXAMPLE 9

A resonator according to this application example of the invention includes the resonator element according to the above application example of the invention, and a package adapted to house the resonator element, and the support arm is fixed to the package.

According to this application example, the resonator with high reliability can be obtained.

APPLICATION EXAMPLE 10

An oscillator according to this application example of the invention includes the resonator element according to the above application example of the invention, and an oscillator circuit electrically connected to the resonator element.

According to this application example, the oscillator with high reliability can be obtained.

APPLICATION EXAMPLE 11

An electronic apparatus according to this application example of the invention includes the resonator element according to the above application example of the invention.

According to this application example, the electronic apparatus with high reliability can be obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a resonator element, a resonator, an oscillator, and an electronic apparatus according to the invention will be explained in detail based on the embodiments shown in the accompanying drawings.

1. Resonator Element

First Embodiment

Figure 1:
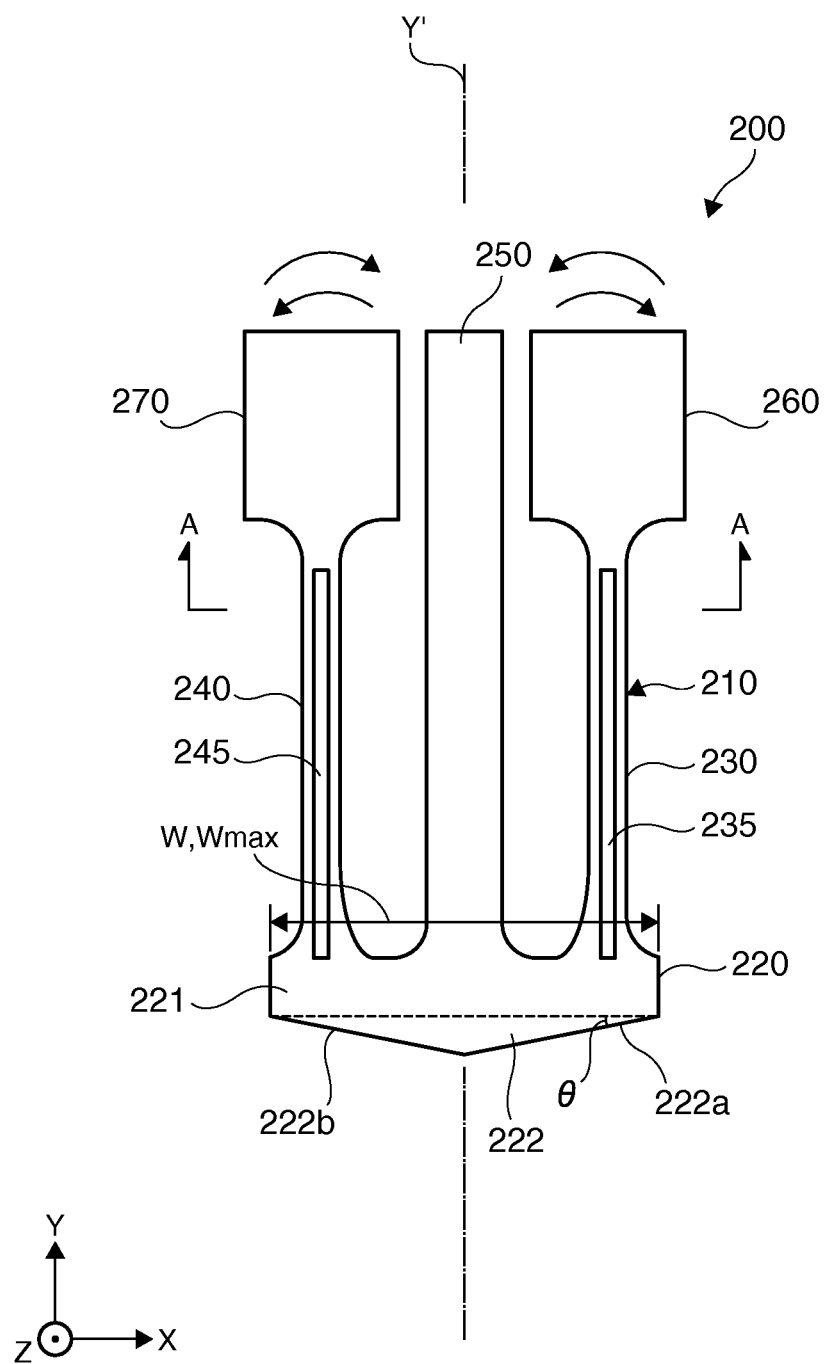
FIG. 1 is a plan view showing a resonator element according to a first embodiment of the invention.
Figure 2:
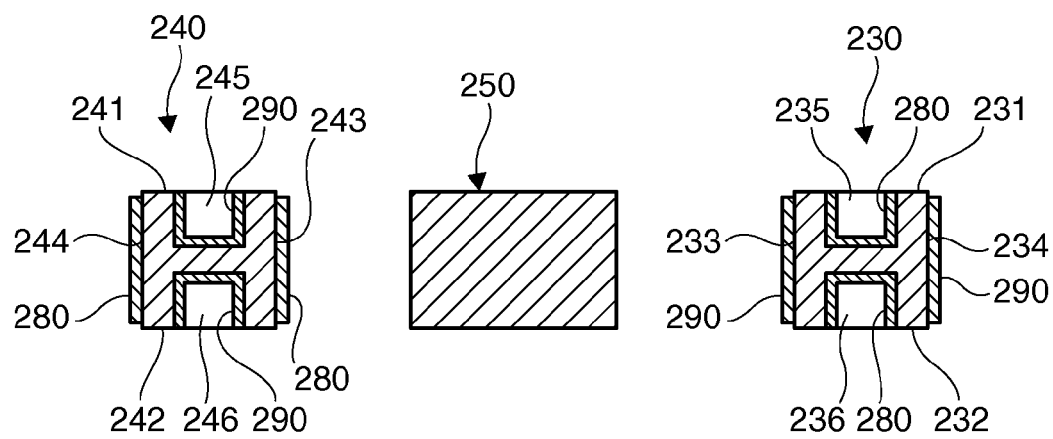
FIG. 2 is a cross-sectional view along the A-A line in FIG. 1.
Figure 2:
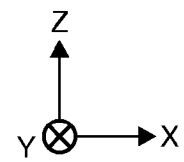
Figures 3A, 3B, 3C:
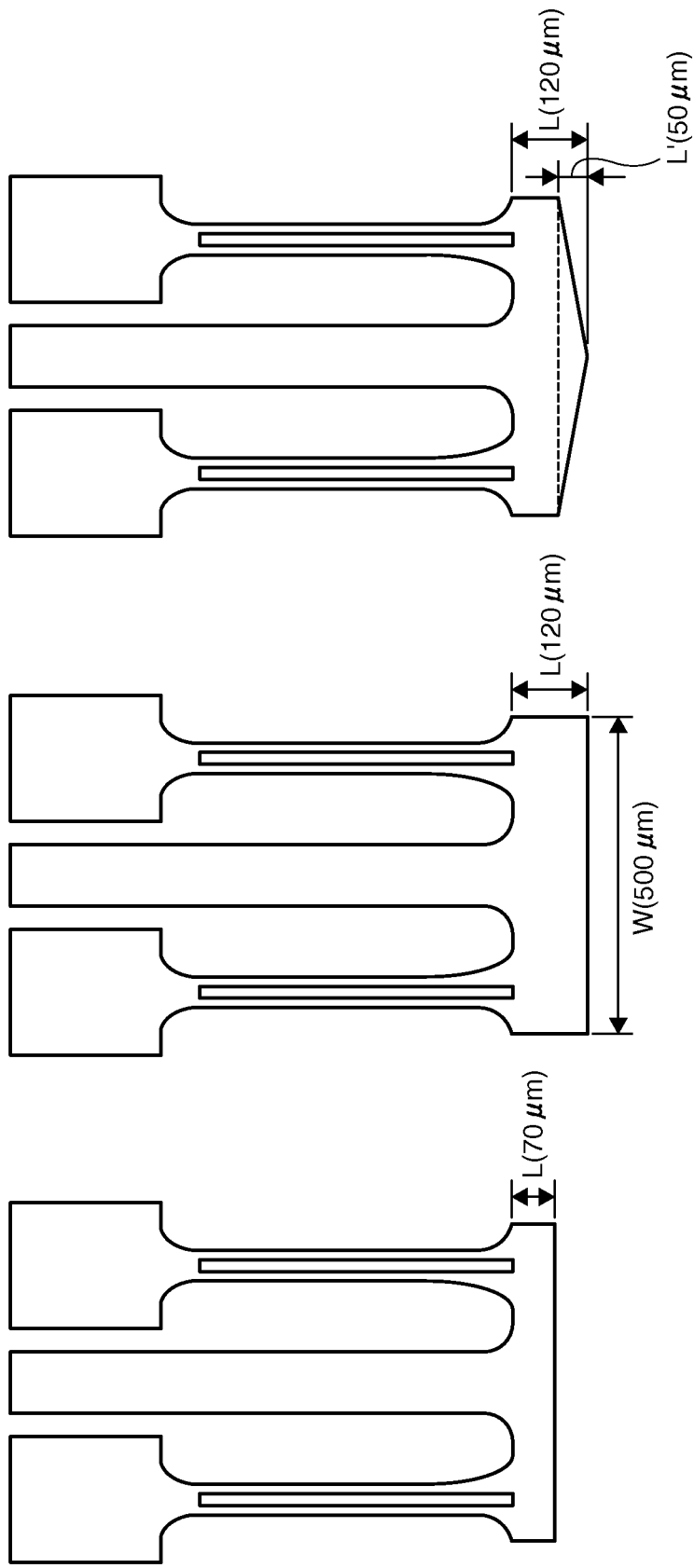
FIGS. 3A through 3C are plan views respectively showing resonator elements used for a simulation.
Figure 4:
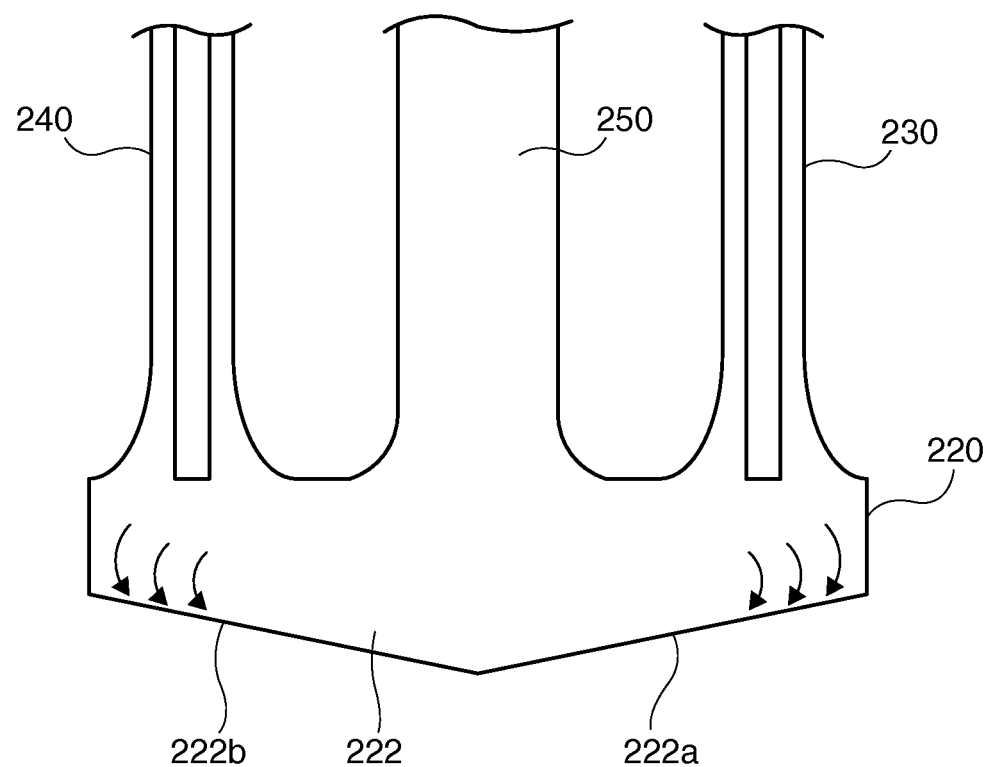
FIG. 4 is a plan view for explaining the principle of vibration leakage suppression.

FIG. 1 is a plan view showing the resonator element according to the first embodiment of the invention, FIG. 2 is a cross-sectional view along the A-A line in FIG. 1, FIGS. 3A through 3C are plan views respectively showing resonator elements used for a simulation, and FIG. 4 is a plan view for explaining the principle of vibration leakage suppression. It should be noted that in each of the drawings, the X axis, the Y axis, and the Z axis are shown as the three axes perpendicular to each other for the sake of convenience of explanation. Further, in the following explanation, the upper side of FIG. 1 is referred to as an "upper side," and the lower side is referred to as a "lower side" for the sake of convenience of explanation. Further, for the sake of convenience of explanation, the plan view viewed from the Z-axis direction is also referred to simply as a "plan view."

The resonator element 200 shown in FIGS. 1 and 2 has a vibrating substrate 210, and driving electrodes formed on the vibrating substrate 210.

The vibrating substrate 210 is formed of, for example, quartz crystal, in particular a Z-cut quartz crystal plate. Thus, the resonator element 200 can exert superior vibration characteristics. The Z-cut quartz crystal plate is a quartz crystal substrate having the Z axis (the light axis) of the quartz crystal as the thickness direction. Although it is preferable for the Z axis to coincide with the thickness direction of the vibrating substrate 210, it results that the Z axis is tilted slightly (e.g., roughly 15° or smaller) with respect to the thickness direction from the view point of reducing the frequency-temperature variation in the vicinity of the room temperature.

The vibrating substrate 210 has a base section 220, two vibrating arms 230, 240 projecting from the base section 220 in the +Y-axis direction and arranged side by side in the X direction, and a support arm 250 projecting from the base section 220 in the +Y-axis direction, and located between the two vibrating arms 230, 240. Such a vibrating substrate 210 is formed to be symmetric about a symmetry axis Y' parallel to the Y axis.

The base section 220 spreads in the XY plane, and has a roughly plate-like shape having a thickness in the Z-axis direction. Such a base section 220 has a main body portion 221 for supporting and connecting the arms 230, 240, and 250 to each other, and a first shrunk-width portion 222 for suppressing the vibration leakage.

As shown in FIG. 1, the main body portion 221 has a width (a length in the X-axis direction) W' roughly uniform along the Y-axis direction. In other words, the main body portion 221 has a roughly rectangular planar shape. Further, the first shrunk-width portion 222 is connected to the outer edge of the main body portion 221 on the −Y-axis direction side of the main body portion 221. In other words, the first shrunk-width portion 222 is disposed on the opposite side to the arms 230, 240, and 250 across the main body portion 221.

The contour of the first shrunk-width portion 222 is composed of tilted portions 222a, 222b each having a linear shape and tilted with respect to both of the X axis and the Y axis in the plan view, wherein one ends (ends on the −Y-axis direction side) of the tilted portions 222a, 222b are connected to each other on the symmetry axis Y'. In other words, the tilted portions 222a, 222b have a substantially symmetrical relationship about, for example, the symmetry axis Y' passing through the midpoint between the vibrating arms 230, 240. Therefore, the first shrunk-width portion 222 has an angle formed by sides, namely the tilted portions 222a, 222b, and has therefore a sharp end. As described later, by making the first shrunk-width portion 222 have such a shape, the vibration leakage can effectively be suppressed, and at the same time, simplification of the configuration of the first shrunk-width portion 222 can be achieved.

It should be noted that although the angle θ formed between the tilted portions 222a, 222b and the X axis is not particularly limited, from the viewpoint of, for example, suppressing the excessive growth in size of the first shrunk-width portion 222, the angle θ is preferably somewhere in a range of 5° or higher and 70° or lower, and more preferably somewhere in a range of 10° or higher and 50° or lower.

Further, the maximum width (the length in the base end in the projection direction) Wmax of the first shrunk-width portion 222 is roughly equal to the width W' of the main body portion 221, and the first shrunk-width portion 222 is formed continuously to the end (corner portion) of the main body portion 221 on the −Y-axis direction side of the main body portion 221 without steps.

Further, in the case of wet-etching the quartz crystal substrate to thereby pattern the vibrating substrate 210, since the crystal face of the quartz crystal appears in the contour of the vibrating substrate 210, by previously forming the tilted portions 222a, 222b parallel to the crystal face on the photomask to thereby pattern the tilted portions 222a, 222b, the variation of the shape is reduced, and the stable performance can be obtained. It is particularly preferable to make the tilted portions 222a, 222b parallel to the crystal face forming an angle of 30° or 60° with respect to the X axis of the quartz crystal.

The support arm 250 extends from the base section 220 in the +Y-axis direction, and is positioned between the vibrating arms 230, 240. Further, the support arm 250 has an elongated shape, and has a uniform width (length in the X direction) throughout the entire area in the longitudinal direction. It should be noted that the shape (in particular the plan view shape) of the support arm 250 is not particularly limited, and can include a portion with a variation in width in the middle of the support arm in the longitudinal direction thereof. Further, the length of the support arm 250 is not required to be the same as the length of the vibrating arms 230, 240, but can be longer or shorter than that of the vibrating arms 230, 240 if needed.

The vibrating arms 230, 240 are arranged side by side in the X direction with a predetermined distance, and each project from the base section 220 in the +Y direction. Further, the vibrating arms 230, 240 have hammerheads 260, 270 disposed on the tip portions thereof, respectively. By providing the hammerheads 260, 270, miniaturization of the resonator element 200 can be achieved, and the frequency of the flexural vibration of the vibrating arms 230, 240 can be lowered. It should be noted that the hammerheads 260. 270 can each have a plurality of widths if needed, or can be eliminated. Further, in the case of disposing the hammerheads 260, 270, the distance between the hammerheads 260. 270 is shortened by making the length of the support arm 250 described above shorter than the length obtained by subtracting the length of the hammerheads 260, 270 from the length of the respective vibrating arms 230, 240, which is advantageous to the miniaturization.

Further, the vibrating arm 230 is provided with a groove 235 having a bottom and opening in one principal surface 231, and a groove 236 having a bottom and opening in the other principal surface 232. Similarly, the vibrating arm 240 is provided with a groove 245 having a bottom and opening in one principal surface 241, and a groove 246 having a bottom and opening in the other principal surface 242. These grooves 235, 236, 245, and 246 are disposed so as to extend in the Y-axis direction, and have the same shape as each other. Therefore, the vibrating arms 230, 240 each have a roughly "H" shaped lateral cross-sectional shape. By forming such grooves 235, 236, 245, and 246, it becomes difficult for the heat generated by the flexural vibration to diffuse (make heat conduction), and the thermoelastic loss can be suppressed in the heat insulating area, which is an area where the flexural vibration frequency (the mechanical flexural vibration frequency) f is higher than a thermal relaxation frequency f0 (f>f0). It should be noted that the grooves 235, 236, 245, and 246 can be provided if needed, and can be eliminated.

Further, as shown in FIG. 2, the vibrating arm 230 is provided with first driving electrodes 280 and second driving electrodes 290. The first driving electrodes 280 are formed on the inside surfaces of the grooves 235, 236, respectively, and the second driving electrodes 290 are formed on the side surfaces 233, 234, respectively. Similarly, the vibrating arm 240 is also provided with the first driving electrodes 280 and the second driving electrodes 290. The first driving electrodes 280 are formed on the side surfaces 243, 244, respectively, and the second driving electrodes 290 are formed on the inside surfaces of the grooves 245, 246, respectively. When applying an alternating voltage between the first and second driving electrodes 280, 290, the vibrating arms 230, 240 vibrate at a predetermined frequency in an in-plane direction (in the direction of the XY plane) so as to repeat approach and separation.

The constituent of the first and second driving electrodes 280, 290 is not particularly limited, and a metal material such as gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), or zirconium (Zr), and an electrically-conductive material such as indium tin oxide (ITO) can be used.

It should be noted that although not shown in the drawings, the first driving electrodes 280 and the second driving electrodes 290 are extracted to the support arm 250 via the base section 220, and the electrical conduction with, for example, connection electrodes provided to a package 300 described later is achieved in the support arm 250.

Hereinabove, the configuration of the resonator element 200 is briefly explained. Then, the fact that the vibration characteristics are improved by providing the first shrunk-width portion 222 will be proved based on a simulation result.

It should be noted that although the simulation using the resonator element having the flexural vibration frequency (the mechanical flexural vibration frequency) f=32.768 kHz, approximately, in the fundamental mode of the flexural vibration in which the vibrating arms 230, 240 have the phases reverse to each other in the plan view is used as a representative, it is confirmed by the inventors that in the case in which the vibrating arms 230, 240 flexurally vibrate with the phases reverse to each other in the plan view, even if in the case of changing the flexural vibration frequency f, the tendency similar to the simulation result described below is obtained.

Further, regarding the dimensions of the vibrating arms 230, 240 of the resonator element used in the present simulation, the length (the length including the hammerheads 260, 270) is 1000 μm, the depth is 150 μm, the width is 80 μm, and the width of the base section 220 is 500 μm. It should be noted that it is confirmed by the inventor that even in the case of changing the dimensions of the vibrating arms 230, 240 and the base section 220, the tendency similar to the simulation result described below is obtained.

Table 1 below is a table showing the variation of the Q value due to the presence or absence of the first shrunk-width portion. It should be noted that the Q value shown in Table 1 is a value taking only the vibration leakage into consideration.

Further, "SIM/0_1" in Table 1 corresponds to the resonator element in which the base section 220 does not have the first shrunk-width portion 222, and the length (the length in the Y direction) L of the base section 220 is 70 μm as shown in FIG. 3A. Further, "SIM/0_2" corresponds to the resonator element in which the base section 220 does not have the first shrunk-width portion 222, and the length L of the base section 220 is 120 μm as shown in FIG. 3B. Further, "SIM/1_1" corresponds to the resonator element in which the base section 220 is provided with the first shrunk-width portion 222, the length L of the base section 220 is 120 μm, and the length L' of the first shrunk-width portion 222 is 50 μm as shown in FIG. 3C. Therefore, SIM/0_1 and SIM/0_2 correspond to the resonator elements belonging to the related art, and SIM/1_1 corresponds to the resonator element belonging to the invention.

TABLE 1

|  | Q value |
| --- | --- |
| SIM/0_1 | 42,008 |
| SIM/0_2 | 46,045 |
| SIM/1_1 | 271,042 |

As is obvious from Table 1, the resonator element corresponding to "SIM/1_1" has the Q value remarkably higher than those of the resonator elements corresponding to "SIM/0_1" and "SIM/0_2." Therefore, it is found out that by including the first shrunk-width portion 222 and including the support arm 250 disposed between the vibrating arms 230, 240, the vibration leakage to be transmitted to the support arm. 250 is suppressed, and thus, the excellent vibration characteristics can be exerted. Further, since the resonator elements corresponding to "SIM/0_1" and "SIM/0_2" different in the length L of the base section 220 both have the low Q values, and the resonator element corresponding to "SIM/0_2" having the base section 220 with the same length L as that of the resonator element corresponding to "SIM/1_1" has the low Q value, it is found out that the Q value is hardly affected by the length of the base section 220, but is significantly affected by the presence or absence of the first shrunk-width portion 222. It should be noted that as the reason therefor, it is possible that although when the vibrating arms 230, 240 flexurally vibrate, the main body portion 221 of the base section 220 is urged to deform as indicated by the arrows shown in FIG. 4 due to the vibration, since the deformation is blocked by the tilted portions 222a, 222b provided to the first shrunk-width portion 222, in other words first shrunk-width portion 222 functions as a beam acting as a support to thereby suppress the deformation of the main body portion 221, and it is inferable that the vibration leakage is suppressed as a result, which leads to the improvement of the Q value.

As described above it is found out that by including the first shrunk-width portion 222, the vibration leakage can be suppressed. Then, the relationship between the size (the length L') of the first shrunk-width portion 222 and the Q value will be explained. Table 2 below is a table showing the relationship between the length L' of the first shrunk-width portion 222 and the Q value.

TABLE 2

|  | L' [μm] | θ[°] | Q value |
| --- | --- | --- | --- |
| SIM/0_1 | 0 | 0 | 42,008 |
| SIM/1_2 | 10 | 2.29 | 68,182 |
| SIM/1_3 | 20 | 4.57 | 112,330 |
| SIM/1_4 | 30 | 6.84 | 179,232 |
| SIM/1_5 | 40 | 9.09 | 247,154 |
| SIM/1_1 | 50 | 11.3 | 271,042 |
| SIM/1_6 | 60 | 13.49 | 240,757 |
| SIM/1_7 | 70 | 15.64 | 190,866 |
| SIM/1_8 | 80 | 17.74 | 153,573 |
| SIM/1_9 | 110 | 23.74 | 101,944 |
| SIM/1_10 | 140 | 29.24 | 107,652 |
| SIM/1_11 | 170 | 34.25 | 209,015 |
| SIM/1_12 | 200 | 38.65 | 356,499 |
| SIM/1_13 | 230 | 42.61 | 376,683 |
| SIM/1_14 | 260 | 46.12 | 331,978 |
| SIM/1_15 | 290 | 49.23 | 302,608 |
| SIM/1_16 | 320 | 52 | 289,829 |

As is obvious from Table 2, the resonator elements corresponding to "SIM/1_1" through "SIM/1_16" belonging to the invention have the Q values higher than that of the resonator element corresponding to "SIM/0_1" belonging to the related art. Therefore, it is found out that regardless of the size, only by including the first shrunk-width portion 222, the vibration leakage is suppressed, and thus the excellent vibration characteristics can be exerted. Further, it is found out that the particularly high Q value (200,000 or more) can be obtained in the range of the angle θ of 6° or higher and 16° or lower, or the range of 30° or higher.

From the simulation result described above, it is proved that by providing the first shrunk-width portion 222, the vibration characteristics are improved.

Second Embodiment

Then, a second embodiment of the invention will be explained.

Figure 5:
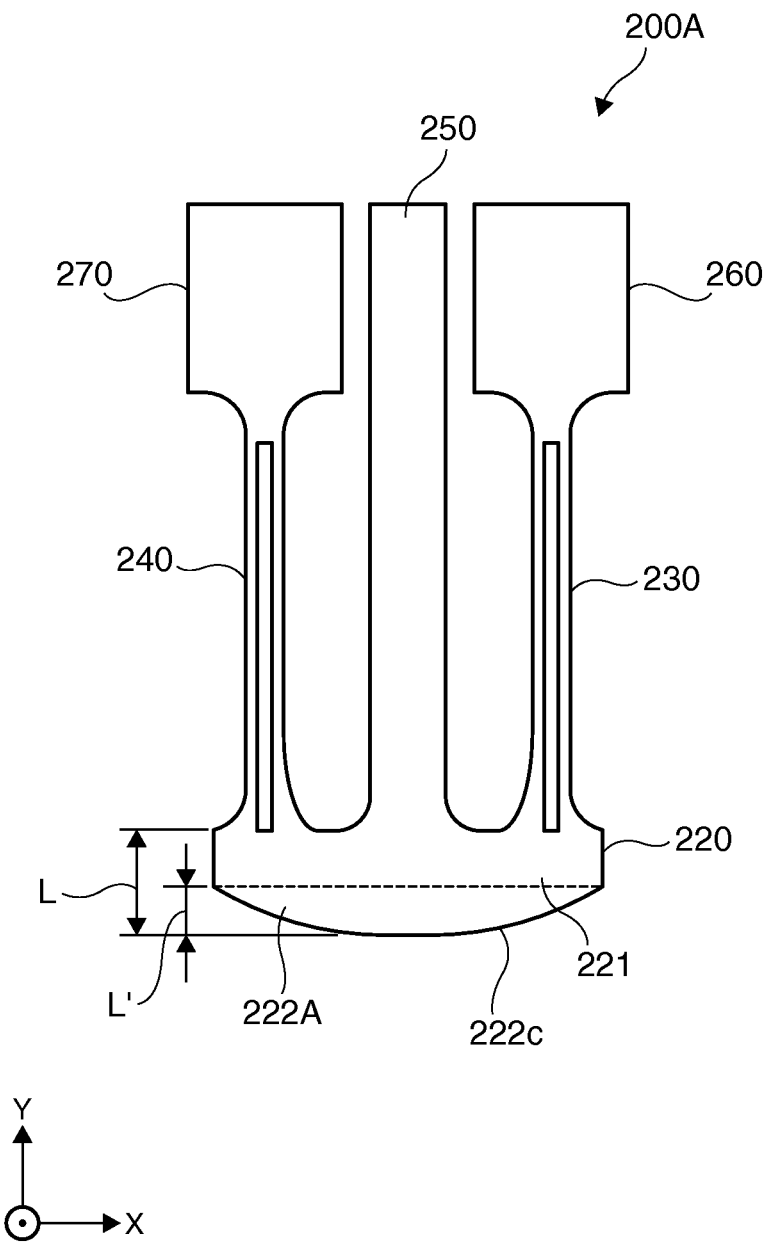
FIG. 5 is a plan view of a resonator element according to a second embodiment of the invention.

FIG. 5 is a plan view of a resonator element according to the second embodiment of the invention.

Hereinafter, the second embodiment will be described mainly focused on the differences from the embodiment described above, and the explanation of substantially the same matters will be omitted.

The second embodiment is substantially the same as the first embodiment except the point that the configuration (the shape) of the first shrunk-width portion is different. It should be noted that in FIG. 5, the components substantially identical to those of the first embodiment described above are denoted with the same reference symbols.

In the resonator element 200A shown in FIG. 5, the contour of the first shrunk-width portion 222A is formed of an arc portion 222c having an arc shape symmetric about the symmetry axis Y', and the both ends of the arc portion 222c are connected to the respective corners of the main body portion 221 located on the −Y-axis direction side of the main body portion 221. The curvature radius of the arc portion 222c is arranged to be uniform throughout the entire area. It should be noted that the curvature radius of the arc portion 222c is not limited to be uniform, but can also increase gradually toward the −Y-axis direction, or can gradually decrease on the contrary. Further, in the case of wet-etching the quartz crystal substrate to thereby pattern the vibrating substrate 210, since the crystal face of the quartz crystal appears on the contour of the vibrating substrate 210, it can also be said that the arc portion 222c is formed of an aggregate of short linear parts in a microscopic view. The "arc shape" is defined to include such a case. Further, in this case, it is possible to form an arc inside (on the main body portion 221 side of) the arc portion 222c formed as the aggregate of the short linear parts by additionally performing wet-etching so that the crystal faces do not appear.

The fact that the vibration characteristics are improved by providing the first shrunk-width portion 222A having such a shape similarly to the first embodiment described above will be proved based on a simulation result. It should be noted that the resonator elements used in the present simulation are substantially the same as those used in the first embodiment described above except the point that the shape of the first shrunk-width portion is different.

Table 3 below is a table showing a relationship between the shape of the first shrunk-width portion and the Q value. It should be noted that the Q value shown in Table 3 is a value taking only the vibration leakage into consideration. Further, "SIM/2_1" corresponds to a resonator element belonging to the present embodiment, in which the length L of the base section 220 is 120 μm, the length L' of the first shrunk-width portion 222 is 50 μm, and the contour of the first shrunk-width portion 222 is formed of the arc portion 222c having the uniform curvature radius.

TABLE 3

|  | Q value |
| --- | --- |
| SIM/1_1 | 271,042 |
| SIM/2_1 | 331,774 |

As is obvious from Table 3, the resonator element corresponding to "SIM/2_1" has the Q value equivalent to (or higher than) that of the resonator element corresponding to "SIM/1_1." Therefore, it is found out that even in the case of providing the contour of the first shrunk-width portion 222A with the arc shape, the vibration leakage is suppressed, and thus the excellent vibration characteristics can be exerted compared to the related art.

Third Embodiment

Then, a third embodiment of the invention will be explained.

Figure 6:
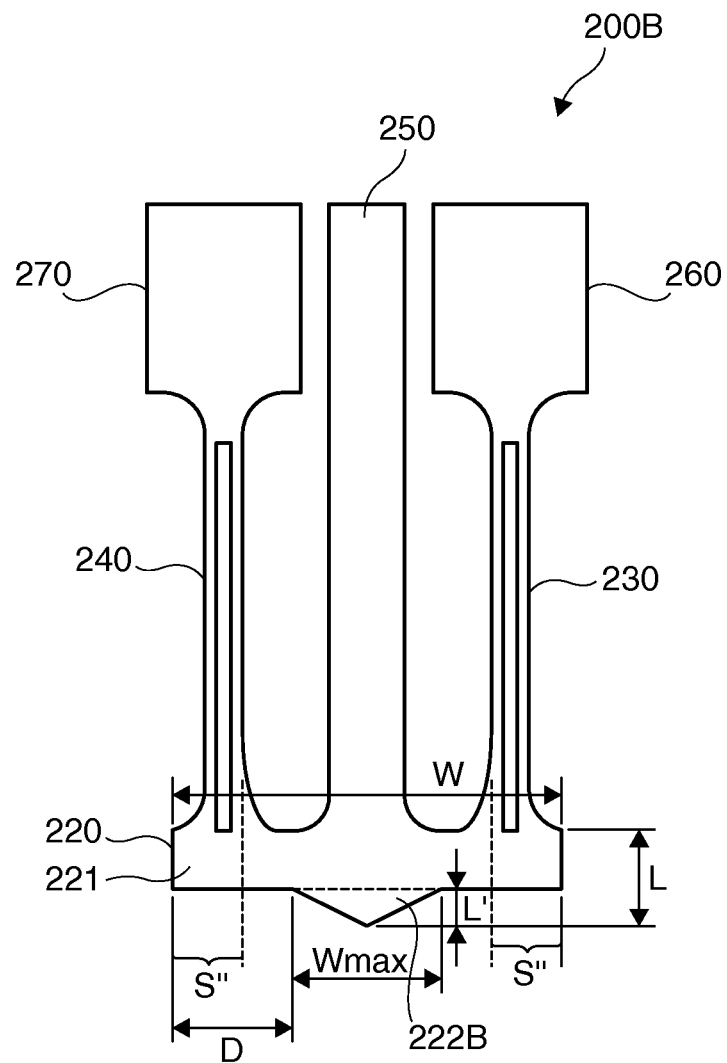
FIG. 6 is a plan view of a resonator element according to a third embodiment of the invention.

FIG. 6 is a plan view of a resonator element according to the third embodiment of the invention.

Hereinafter, the third embodiment will be described mainly focused on the differences from the embodiments described above, and the explanation of substantially the same matters will be omitted.

The third embodiment is substantially the same as the first embodiment except the point that the configuration (the shape) of the first shrunk-width portion is different. It should be noted that in FIG. 6, the components substantially identical to those of the first embodiment described above are denoted with the same reference symbols.

In the resonator element 200B shown in FIG. 6, the maximum width (the maximum length in the X-axis direction) Wmax of the first shrunk-width portion 222B is arranged to be smaller than the width W of the main body portion 221. Therefore, the first shrunk-width portion 222B is formed so as to be connected to a middle portion of the edge (the side) of the main body portion 221 located on the -Y-axis direction side of the main body portion 221 except the both ends of the edge.

The fact that the vibration characteristics are improved by providing such a first shrunk-width portion 222B similarly to the first embodiment described above will be proved based on a simulation result. It should be noted that the resonator element used in the present simulation is substantially the same as "SIM/1_1" used in the first embodiment described above except the point that the shape (the width) of the first shrunk-width portion is different.

Table 4 below is a table showing a relationship between the width of the first shrunk-width portion and the Q value. It should be noted that the Q value shown in Table is a value taking only the vibration leakage into consideration.

TABLE 4

|  | Width [μm] | Q value |
| --- | --- | --- |
| SIM/1_1 | 500 | 271,042 |
| SIM/3_1 | 460 | 218,607 |
| SIM/3_2 | 420 | 162,183 |
| SIM/3_3 | 380 | 121,570 |
| SIM/3_4 | 340 | 98,526 |
| SIM/3_5 | 300 | 92,566 |
| SIM/3_6 | 260 | 102,416 |
| SIM/3_7 | 220 | 122,229 |
| SIM/3_8 | 180 | 118,771 |
| SIM/3_9 | 140 | 84,522 |
| SIM/3_10 | 100 | 58,453 |
| SIM/3_11 | 60 | 46,763 |
| SIM/0_1 | 0 | 42,008 |
| SIM/0_2 | 0 | 46,045 |

As is obvious from Table 4, the resonator elements corresponding to "SIM/3_1" through "SIM/3_11" belonging to the present embodiment have the Q values higher than those of the resonator elements corresponding to "SIM/0_1" and "SIM/0_2" belonging to the related art. Therefore, it is found out that by including such a first shrunk-width portion 222B as in the present embodiment, the vibration leakage is also suppressed, and thus the excellent vibration characteristics can be exerted.

Further, it is found that on the whole, the larger the width of the first shrunk-width portion 222B becomes, the higher the Q value becomes. Here, "SIM/3_1," "SIM/3_2," "SIM/3_3," and "SIM/3_4" correspond to the resonator elements in which the both ends of the first shrunk-width portion 222B are located outside the inside surfaces of the vibrating arms 230, 240 (located inside the area S" in FIG. 6), in other words, the resonator elements in which the maximum width (the maximum length in the X-axis direction) Wmax of the first shrunk-width portion 222B is larger than the distance between the vibrating arms 230, 240, and it is shown that these resonator elements all have the sufficiently high Q values. Further, it is shown that these resonator elements in whole have the high Q values in the range in which the maximum width Wmax of the first shrunk-width portion 222 fulfills Wmax>½ W (D<125).

Fourth Embodiment

Then, a fourth embodiment of the invention will be explained.

Figure 7:
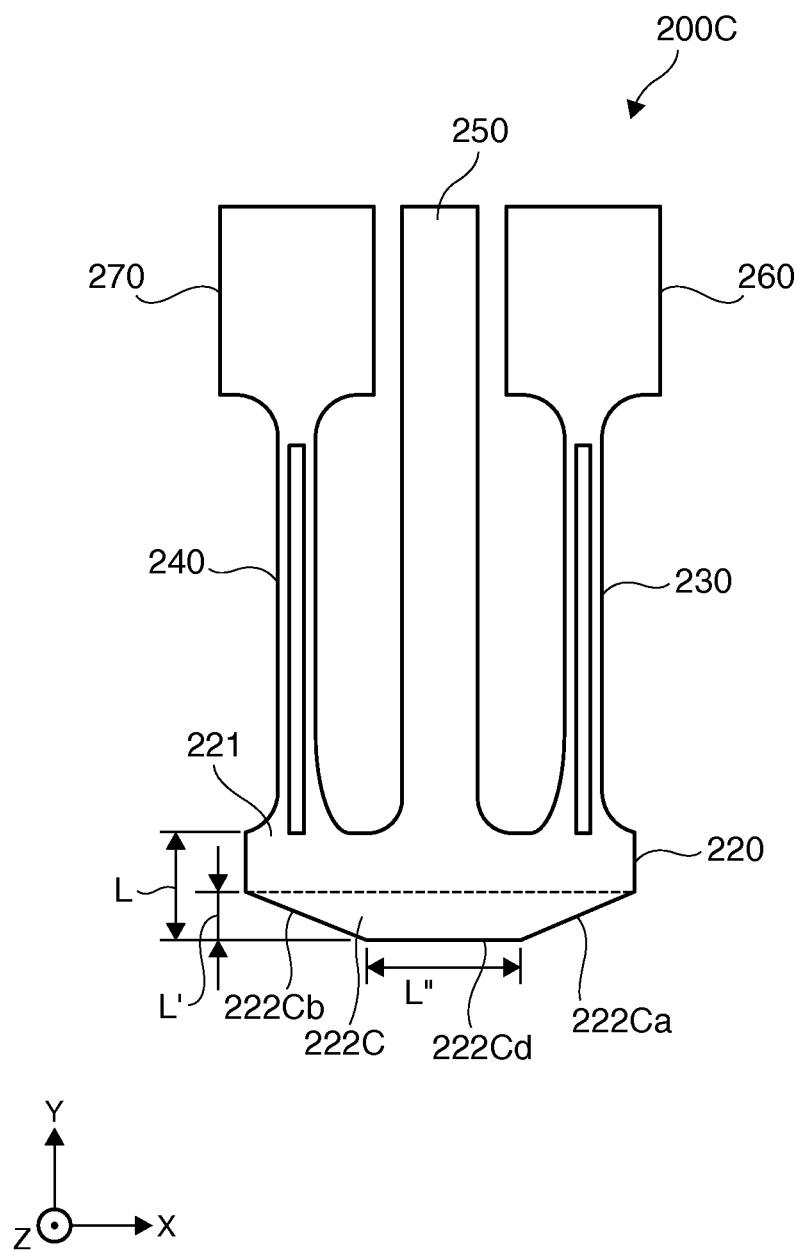
FIG. 7 is a plan view of a resonator element according to a fourth embodiment of the invention.

FIG. 7 is a plan view of a resonator element according to the fourth embodiment of the invention.

Hereinafter, the fourth embodiment will be described mainly focused on the differences from the embodiments described above, and the explanations regarding substantially the same matters will be omitted.

The fourth embodiment is substantially the same as the first embodiment except the point that the configuration (the shape) of the first shrunk-width portion is different. It should be noted that in FIG. 7, the components substantially identical to those of the first embodiment described above are denoted with the same reference symbols.

In the resonator element 200C shown in FIG. 7, the contour of the first shrunk-width portion 222C includes tilted portions 222Ca, 222Cb each having a linear shape and tilted with respect to both of the X axis and the Y axis in the plan view, and a connection portion 222Cd, which connects the ends of the respective tilted portions 222Ca, 222Cb on the −Y-axis direction side thereof to each other and is parallel to the X axis.

The fact that by disposing such a first shrunk-width portion 222B, the vibration characteristics are also improved similarly to the first embodiment described above will be proved based on a simulation result. It should be noted that the resonator element used in the present simulation is substantially the same as "SIM/1_1" used in the first embodiment described above except the point that the shape of the first shrunk-width portion is different.

Table 5 described below is a table showing a relationship between the shape of the first shrunk-width portion and the Q value. It should be noted that the Q value shown in Table 5 is a value taking only the vibration leakage into consideration. Further, "SIM/4_1" corresponds to a resonator element belonging to the present embodiment, in which the length L of the base section 220 is 120 μm, the length L' of the first shrunk-width portion 222 is 50 μm, and the length L" of the connection portion 222Cd is 250 μm.

TABLE 5

|  | Q value |
| --- | --- |
| SIM/1_1 | 271,042 |
| SIM/4_1 | 104,141 |
| SIM/0_1 | 42,008 |
| SIM/0_2 | 46,045 |

As is obvious from Table 5, the resonator element corresponding to "SIM/4_1" belonging to the present embodiment has the Q value higher than those of the resonator elements corresponding to "SIM/0_1" and "SIM/0_2" belonging to the related art. Therefore, it is found out that by including such a first shrunk-width portion 222C as in the present embodiment, the vibration leakage is also suppressed, and thus the excellent vibration characteristics can be exerted.

Fifth Embodiment

Then a fifth embodiment of the invention will be explained.

Figure 8:
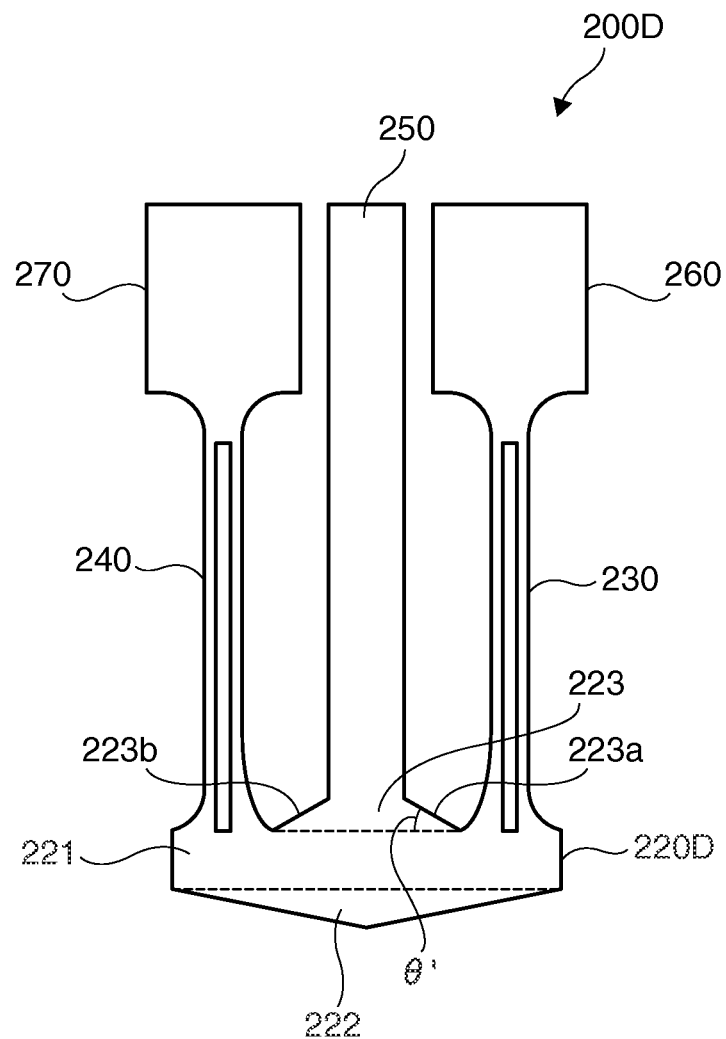
FIG. 8 is a plan view of a resonator element according to a fifth embodiment of the invention.

FIG. 8 is a plan view of a resonator element according to the fifth embodiment of the invention.

Hereinafter, the fifth embodiment will be described mainly focused on the differences from the embodiments described above, and the explanation of substantially the same matters will be omitted.

The fifth embodiment is substantially the same as the first embodiment except the point that the configuration (the shape) of the base section is different. It should be noted that in FIG. 8, the components substantially identical to those of the first embodiment described above are denoted with the same reference symbols.

In the resonator element 200D shown in FIG. 8, the base section 220D has the main body portion 221, the first shrunk-width portion 222 located on the −Y-axis direction side of the main body portion 221, and a second shrunk-width portion 223 located on the +Y-axis direction side of the main body portion 221, and located between the vibrating arms 230, 240. In other words, the base section 220D of the present embodiment has two shrunk-width portions 222, 223 disposed so as to be opposed to each other across the main body portion 221.

Further, the second shrunk-width portion 223 is disposed between the main body portion 221 and the support arm 250. In other words, the support arm 250 projects from the second shrunk-width portion 223. By disposing the second shrunk-width portion 223 in such an arrangement, the vibration of the vibrating arms 230, 240 can be prevented from being transmitted to the support arm 250 via the base section 220, and thus, the vibration leakage can more effectively be suppressed. Specifically, although the vibration of the vibrating arms 230, 240 is canceled out (relaxed, absorbed) by the first shrunk-width portion 222, in some cases, the vibration which has failed to be canceled out by the first shrunk-width portion 222 may propagate to the support arm 250. In such a case, since the vibration can be canceled out (relaxed, absorbed) by the second shrunk-width portion 223, the vibration leakage can more efficiently be suppressed.

In the present embodiment, the contour of the second shrunk-width portion 223 is composed of tilted portions 223a, 223b disposed so as to be opposed to each other in the X direction, and each tilted with respect to the both axes of the X axis and the Y axis. By forming the second shrunk-width portion 223 to have such a shape, simplification of the configuration of the second shrunk-width portion 223 can be achieved. It should be noted that the angle θ' formed between the tilted portions 223a, 223b and the X axis is not particularly limited, but is preferably equal roughly to the angle θ formed between the tilted portions 222a, 222b and the X axis.

According also to such a fifth embodiment as described above, substantially the same advantages as in the first embodiment described above can be obtained.

Sixth Embodiment

Then, a sixth embodiment of the invention will be explained.

Figure 9:
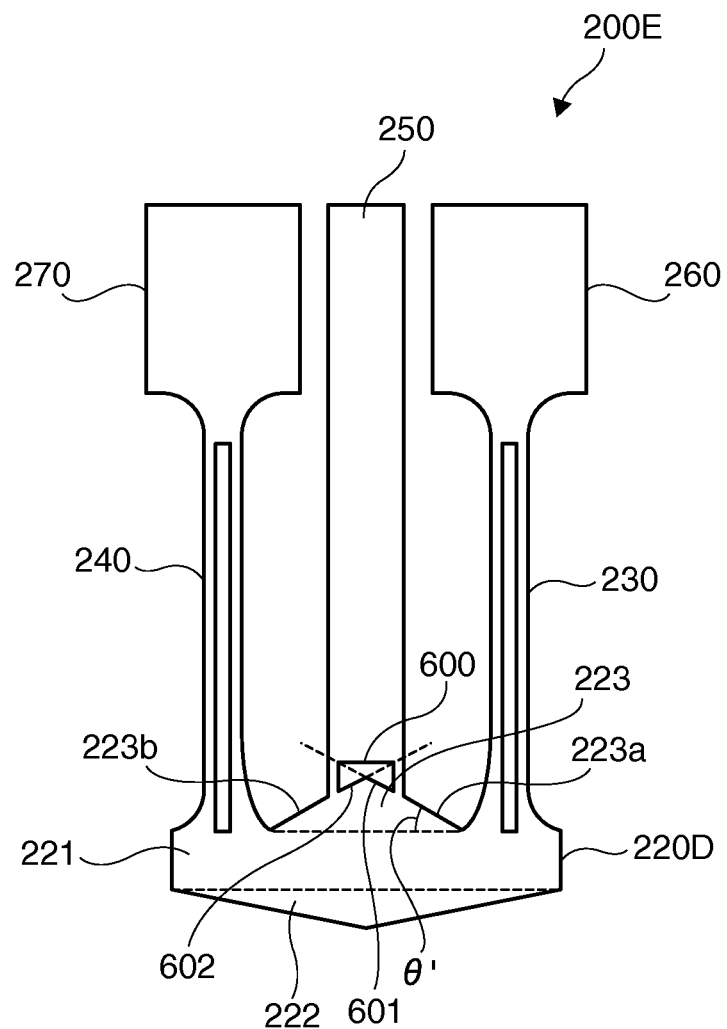
FIG. 9 is a plan view of a resonator element according to a sixth embodiment of the invention.

FIG. 9 is a plan view of a resonator element according to the sixth embodiment of the invention.

Hereinafter, the sixth embodiment will be described mainly focused on the differences from the embodiments described above, and the explanation of substantially the same matters will be omitted.

The sixth embodiment is substantially the same as the fifth embodiment except the point that the support arm is provided with a through hole. It should be noted that in FIG. 9, the components substantially identical to those of the embodiments described above are denoted with the same reference symbols.

In the resonator element 200E shown in FIG. 9, the base end portion of the support arm 250 is provided with the through hole 600 penetrating in the thickness direction of the base end portion of the support arm 250. By providing such a through hole 600, the natural vibration frequency of the in-phase mode of the vibrating arms 230, 240 can be shifted toward the lower frequency side. Therefore, the difference between the natural resonant frequency of the in-phase mode and the natural resonant frequency of the reversed-phase mode can be increased, and the vibration characteristics of the resonator element 200 are improved.

In particular, the contour of the through hole 600 on the base end side of the through hole 600 has a first extending portion 601 extending along the extended line of the tilted portion 223a, and a second extending portion 602 extending along the extended line of the tilted portion 223b, and is configured to have a shape obtained by connecting one ends of the first and second extending portions 601, 602 to each other. According to the through hole 600 having such a shape as described above, since it is possible to make the area on the base section 220D side of the through hole 600 function as the second shrunk-width portion 223, the area of the second shrunk-width portion 223 can be increased compared to, for example, the fifth embodiment described above.

It should be noted that the through hole 600 is disposed between the base section and a fixation region to be bonded to an electrically-conductive adhesive 351 described later.

According also to such a sixth embodiment as described above, similarly to the fifth embodiment described above, since the vibration, which has failed to sufficiently be canceled out in the first shrunk-width portion, is canceled out in the second shrunk-width portion 223 to thereby suppress the vibration urged to be transmitted to the support arm 250, the vibration leakage prevention effect superior to the first embodiment can be realized.

2. Resonator

Then, the resonator (the resonator according to the invention) to which the resonator element according to the invention is applied will be explained.

Figure 10:
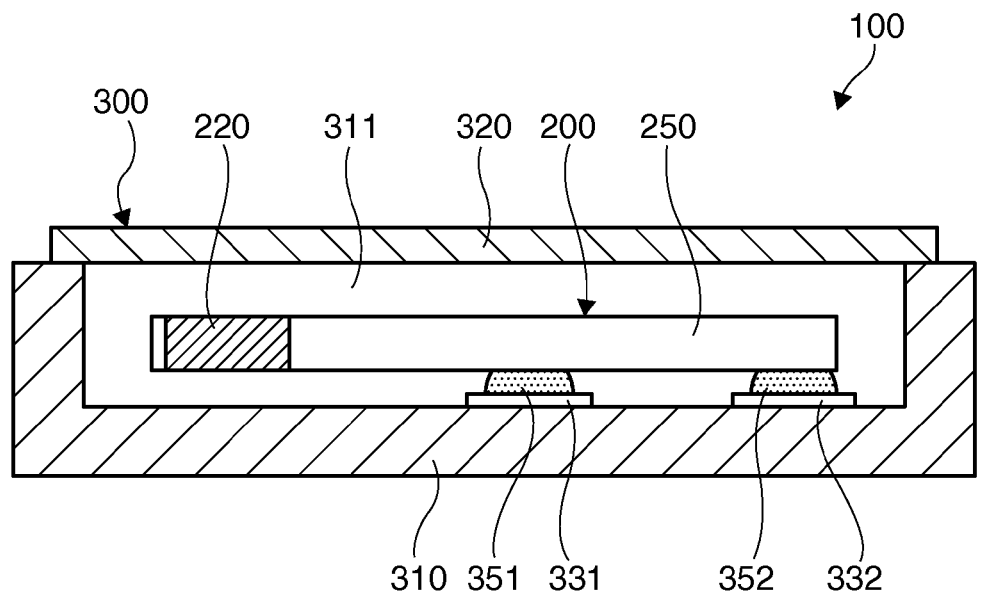
FIG. 10 is a diagram showing a resonator according to the invention.

The resonator 100 shown in FIG. 10 has the resonator element 200 and a package 300 for housing the resonator element 200.

The package 300 has a base substrate 310 of a cavity type having a recessed section 311 opening in an upper surface, and a lid (a lid body) 320 bonded to the base substrate 310 so as to cover the opening of the recessed section 311, and houses the resonator element 200 in the internal space thereof. Further, the internal space is formed airtightly.

The base substrate 310 is formed of a material having an insulating property. Such a material is not particularly limited, and a variety of types of ceramics such as oxide ceramics, nitride ceramics, or carbide ceramics, for example, can be used. In contrast, the lid 320 is formed of a member having a linear expansion coefficient similar to that of the constituent material of the base substrate 310. In the case in which the ceramics described above is used as the constituent material of the base substrate 310, an alloy such as kovar can be used as such a material.

The bottom surface of the recessed section 311 is provided with two connection electrodes 331, 332, and the connection electrodes 331, 332 are electrically connected to mounting electrodes not shown formed on the lower surface of the base substrate 310 via penetration electrodes and inter-layer wiring not shown, respectively.

The resonator element 200 housed in the housing space is supported by and fixed to the base substrate 310 in the support arm 250 via a pair of electrically-conductive adhesives 351, 352 applied to the two fixation regions of the support arm 250. The one electrically-conductive adhesive 351 is disposed so as to electrically connect the connection electrode 331 and the first driving electrode 280 to each other, and the other electrically-conductive adhesive 352 is disposed so as to electrically connect the connection electrode 332 and the second driving electrode 290 to each other.

3. Oscillator

Then, the oscillator (the oscillator according to the invention) to which the resonator element according to the invention is applied will be explained.

Figure 11:
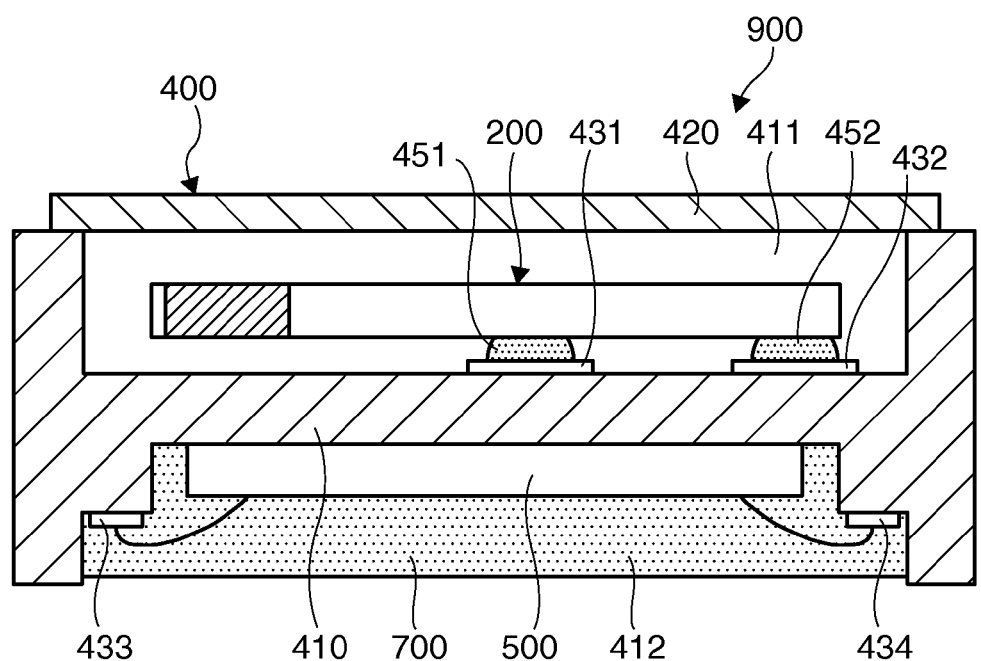
FIG. 11 is a diagram showing an oscillator according to the invention.

The oscillator 900 shown in FIG. 11 has the resonator element 200, a package 400 for housing the resonator element 200, and an IC chip (a chip part) 500 for driving the resonator element 200.

The package 400 has a base substrate 410 and a lid (a lid body) 420 bonded to the base substrate 410.

The base substrate 410 has a first recessed section 411 opening in the upper surface, and a second recessed section 412 opening in the lower surface.

The opening of the first recessed section 411 is blocked by the lid 420, and the resonator element 200 is housed in the inside thereof. Further, two connection electrodes 431, 432 are formed inside the first recessed section 411. The resonator element 200 housed in the first recessed section 411 is supported by and fixed to the base substrate 410 in the support arm 250 via the pair of electrically-conductive adhesives 451, 452. Further, the one electrically-conductive adhesive 451 is disposed so as to electrically connect the connection electrode 431 and the first driving electrode 280 to each other, and the other electrically-conductive adhesive 452 is disposed so as to electrically connect the connection electrode 432 and the second driving electrode 290 to each other.

On the other hand, the IC chip 500 is housed inside the second recessed section 412, and the IC chip 500 is fixed to the base substrate 410 via an adhesive. Further, at least two IC connection electrodes 433, 434 are formed inside the second recessed section 412. The IC connection electrode 433 is electrically connected to the IC chip 500 with a bonding wire, and at the same time, electrically connected to the connection electrode 431 via a penetration electrode and inter-layer wiring not shown. Similarly, the IC connection electrode 434 is electrically connected to the IC chip 500 with a bonding wire, and at the same time, electrically connected to the connection electrode 432 via a penetration electrode and inter-layer wiring not shown. Further, the second recessed section 412 is filled with a resin material 700, and the IC chip 500 is encapsulated with the resin material 700.

The IC chip 500 has a driver circuit (an oscillator circuit) for controlling the drive of the resonator element 200, and by driving the resonator element 200 using the IC chip 500, a signal with a predetermined frequency can be taken out.

4. Electronic Apparatus

Then, the electronic apparatus (the electronic apparatus according to the invention) to which the resonator element according to the invention is applied will be explained in detail with reference to FIGS. 12 through 15.

Figure 12:
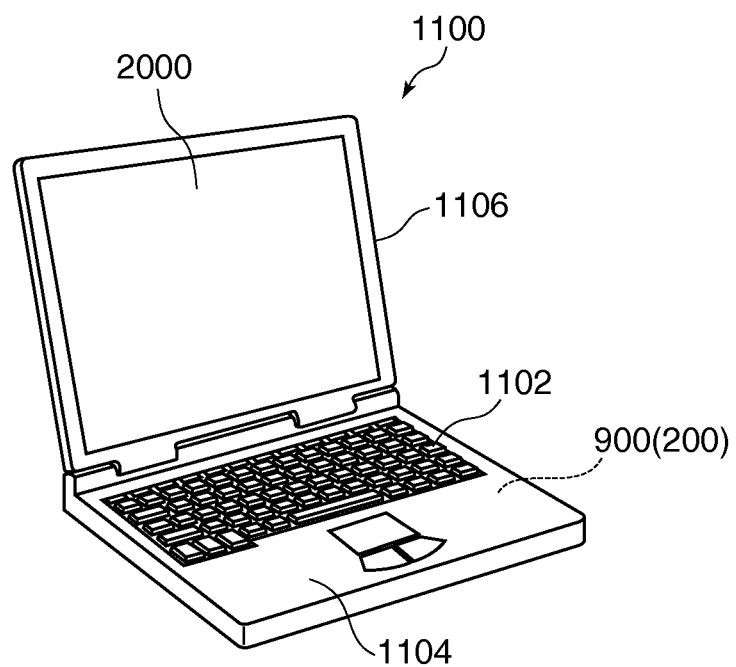
FIG. 12 is a perspective view showing a configuration of a mobile type (or laptop type) personal computer as an example of the electronic apparatus equipped with the resonator element according to the invention.

FIG. 12 is a perspective view showing a configuration of a mobile type (or laptop type) personal computer as an example of the electronic apparatus equipped with the resonator element according to the invention. In the drawing, the personal computer 1100 includes a main body section 1104 provided with a keyboard 1102, and a display unit 1106 provided with a display section 2000, and the display unit 1106 is pivotally supported with respect to the main body section 1104 via a hinge structure. Such a personal computer 1100 incorporates the oscillator 900 (the resonator element 200).

Figure 13:
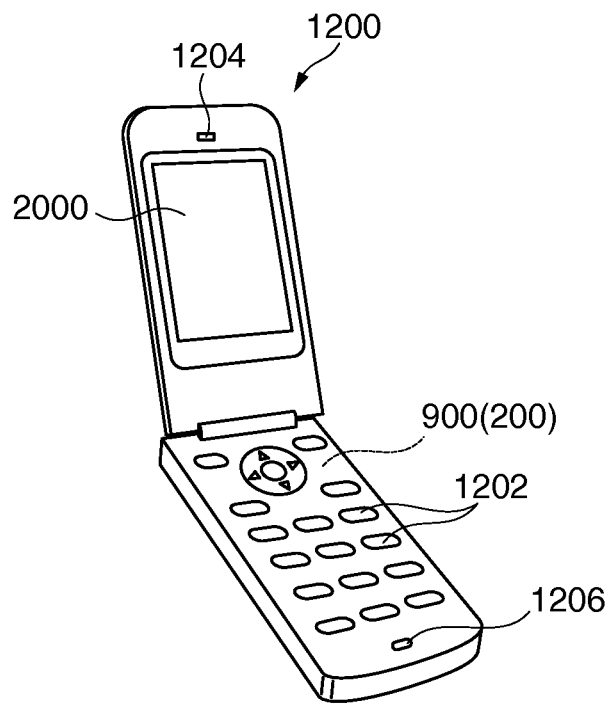
FIG. 13 is a perspective view showing a configuration of a cellular phone (including PHS) as an example of the electronic apparatus equipped with the resonator element according to the invention.

FIG. 13 is a perspective view showing a configuration of a cellular phone (including PHS) as an example of the electronic apparatus equipped with the resonator element according to the invention. In this drawing, the cellular phone 1200 is provided with a plurality of operation buttons 1202, an ear piece 1204, and a mouthpiece 1206, and the a display section 2000 is disposed between the operation buttons 1202 and the ear piece 1204. Such a cellular phone 1200 incorporates the oscillator 900 (the resonator element 200).

Figure 14:
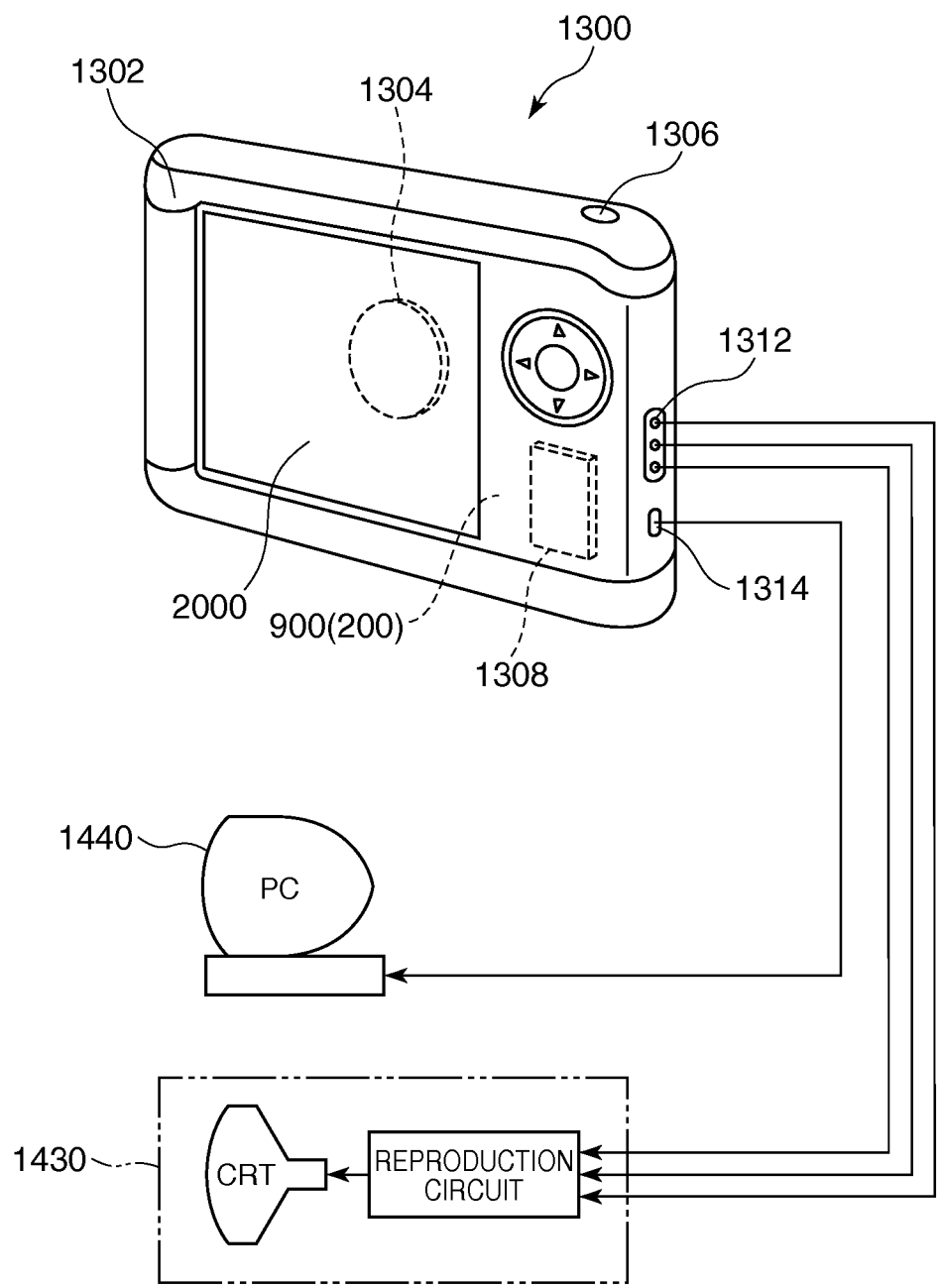
FIG. 14 is a perspective view showing a configuration of a digital still camera as an example of the electronic apparatus equipped with the resonator element according to the invention.

FIG. 14 is a perspective view showing a configuration of a digital still camera as an example of the electronic apparatus equipped with the resonator element according to the invention. It should be noted that connection with external equipment is also shown schematically in this drawing. Here, conventional cameras expose a silver salt film to an optical image of an object, while the digital still camera 1300 performs photoelectric conversion on an optical image of an object by an imaging element such as a CCD (a charge coupled device) to generate an imaging signal (an image signal).

The case (body) 1302 of the digital still camera 1300 is provided with a display section on the back surface thereof to form a configuration of displaying an image in accordance with the imaging signal from the CCD, wherein the display section functions as a viewfinder for displaying an electronic image of the object. Further, the front surface (the back side in the drawing) of the case 1302 is provided with a light receiving unit 1304 including an optical lens (an imaging optical system), the CCD, and so on.

When the photographer confirms an object image displayed on the display section, and then pushes a shutter button 1306 down, the imaging signal from the CCD at that moment is transferred to and stored in the memory device 1308. Further, the digital still camera 1300 is provided with video signal output terminals 1312 and an input-output terminal 1314 for data communication disposed on a side surface of the case 1302. Further, as shown in the drawing, a television monitor 1430 and a personal computer 1440 are respectively connected to the video signal output terminals 1312 and the input-output terminal 1314 for data communication according to needs. Further, there is adopted the configuration in which the imaging signal stored in the memory device 1308 is output to the television monitor 1430 and the personal computer 1440 in accordance with a predetermined operation. Such a digital still camera 1300 incorporates the oscillator 900 (the resonator element 200).

Figure 15:
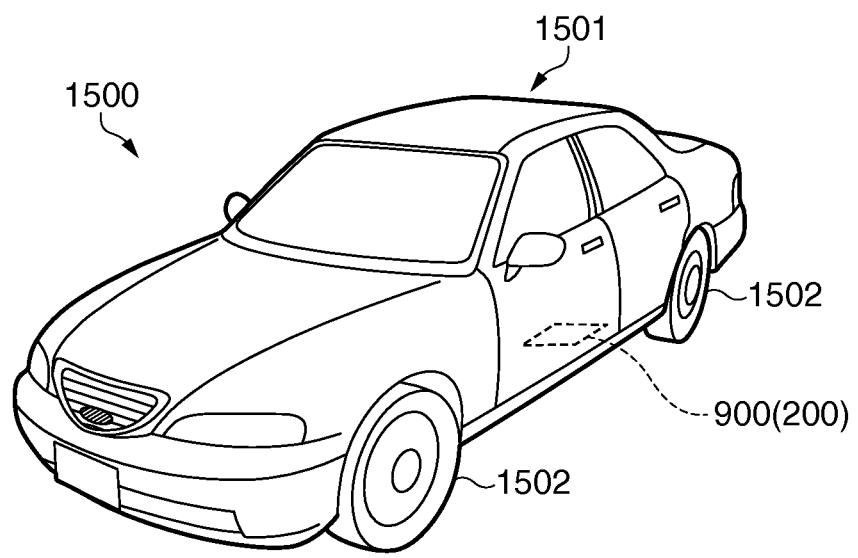
FIG. 15 is a perspective view showing a configuration of a mobile object (a vehicle) as an example of the electronic apparatus equipped with the resonator element according to the invention.

FIG. 15 is a perspective view showing a configuration of a mobile object (a vehicle) as an example of the electronic apparatus equipped with the resonator element according to the invention. In the drawing, the mobile object 1500 has a vehicle body 1501, and four wheels 1502, and is configured to rotate the wheels 1502 by a power source (an engine) not shown provided to the vehicle body 1501. Such a mobile object 1500 incorporates the oscillator 900 (the resonator element 200).

It should be noted that, as the electronic apparatus equipped with the resonator element according to the invention, there can be cited, for example, an inkjet ejection device (e.g., an inkjet printer), a laptop personal computer, a television set, a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator besides the personal computer (the mobile personal computer) shown in FIG. 12, the cellular phone shown in FIG. 13, the digital still camera shown in FIG. 14, and the mobile object shown in FIG. 15.

Although the resonator element, the resonator, the oscillator, and the electronic apparatus according to the invention are hereinabove explained based on the embodiments shown in the accompanying drawings, the invention is not limited to these embodiments, but the configuration of each of the components can be replaced with one having an arbitrary configuration with an equivalent function. Further, it is possible to add any other components to the invention. Further, it is also possible to arbitrarily combine any of the embodiments.

Further, the contour of the shrunk-width portion of the embodiment described above can be provided with a projecting section or a recessed section (a cutout).

The entire disclosure of Japanese Patent Application No. 2012-166116, filed Jul. 26, 2012 is expressly incorporated by reference herein.

What is claimed is:

1. A resonator element comprising:
a base section;
a pair of vibrating arms projecting from the base section on a same side, and arranged with a distance in a direction intersecting with a direction of the projection in a plan view; and
a support arm disposed between the pair of vibrating arms, and projecting from the base section on the same side as the pair of vibrating arms,
wherein the base section includes a first shrunk-width portion disposed on an opposite side to the side on which the support arm projects taking a center of the base section as a boundary, and having a width in the intersecting direction gradually decreasing with a distance from the support arm in a plan view, and
wherein a maximum value of a width of the first shrunk-width portion in the intersecting direction is larger than an amount of the distance.

2. The resonator element according to claim 1, wherein a contour of the first shrunk-width portion has a symmetric shape having a pair of tilted portions each having a linear shape about a line along a direction perpendicular to the intersecting direction in a plan view.

3. The resonator element according to claim 2, wherein the first shrunk-width portion is provided with an angle formed by the pair of tilted portions used as sides.

4. A resonator comprising:
the resonator element according to claim 2; and
a package adapted to house the resonator element,
wherein the support arm is fixed to the package.

5. A resonator comprising:
the resonator element according to claim 3; and
a package adapted to house the resonator element,
wherein the support arm is fixed to the package.

6. An oscillator comprising:
the resonator element according to claim 2; and
an oscillator circuit electrically connected to the resonator element.

7. An oscillator comprising:
the resonator element according to claim 3; and
an oscillator circuit electrically connected to the resonator element.

8. An electronic apparatus comprising:
the resonator element according to claim 2.

9. An electronic apparatus comprising:
the resonator element according to claim 3.

10. The resonator element according to claim 1, wherein a contour of the first shrunk-width portion has an arc-like symmetric shape about a line along a direction perpendicular to the intersecting direction in a plan view.

11. A resonator comprising:
the resonator element according to claim 10; and
a package adapted to house the resonator element,
wherein the support arm is fixed to the package.

12. An oscillator comprising:
the resonator element according to claim 10; and
an oscillator circuit electrically connected to the resonator element.

13. An electronic apparatus comprising:
the resonator element according to claim 10.

14. The resonator element according to claim 1, wherein
the base section of the support arm is provided with a through hole penetrating in a thickness direction of the base section.

15. The resonator element according to claim 1, wherein
the base section includes a second shrunk-width portion disposed between the pair of vibrating arms, and having a length in the intersecting direction gradually decreasing along a direction in which the vibrating arms project, and
the support arm projects from the second shrunk-width portion.

16. A resonator comprising:
the resonator element according to claim 1; and
a package adapted to house the resonator element,
wherein the support arm is fixed to the package.

17. An oscillator comprising:
the resonator element according to claim 1; and
an oscillator circuit electrically connected to the resonator element.

18. An electronic apparatus comprising:
the resonator element according to claim 1.

19. A resonator element comprising:
a base section;
a pair of vibrating arms extending from one side of the base section;
a support arm disposed between the pair of vibrating arms, and extending from the one side of the base section;
a projection section disposed in an area on the other side of the base section, which is an opposite side of the one side of the base section, and corresponds to the support arm; and
a pair of shrunk-width portions respectively disposed on both sides of the projection section, each having a width in a direction in which the pair of vibrating arms are arranged, the width increasing along a direction toward the one side of the base section, and
wherein a maximum value of a width of each shrunk-width portion in the direction in which the pair of vibrating arms are arranged is larger than a distance from an end of the base to a symmetry axis of the base.

* * * * *